(12) United States Patent
Azadet

(10) Patent No.: US 12,348,251 B2
(45) Date of Patent: Jul. 1, 2025

(54) METHOD AND SYSTEM FOR MULTI-BAND DIGITAL PRE-DISTORTION USING A CANONICAL FORM WITH REDUCED DIMENSION LOOK-UP TABLE

(71) Applicant: Intel Corporation, Santa Clara, CA (US)

(72) Inventor: Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 860 days.

(21) Appl. No.: 17/358,062

(22) Filed: Jun. 25, 2021

(65) Prior Publication Data

US 2022/0416823 A1 Dec. 29, 2022

(51) Int. Cl.
*H04B 1/04* (2006.01)

(52) U.S. Cl.
CPC .................. *H04B 1/0475* (2013.01)

(58) Field of Classification Search
CPC ..... H04B 1/0475; H03F 1/3247; H03F 3/195; H03F 3/245; H03F 2200/111; H03F 2200/451; H03F 2201/3233; H03F 1/3258; H03F 1/3252
USPC ....................................................... 375/296
See application file for complete search history.

(56) References Cited

U.S. PATENT DOCUMENTS

| 2015/0032788 A1* | 1/2015 | Velazquez ............... H04L 25/14 708/819 |
| 2015/0146822 A1* | 5/2015 | Copeland ............. H04B 1/0483 375/297 |

FOREIGN PATENT DOCUMENTS

CN 107895074 A 4/2018

OTHER PUBLICATIONS

Ding et al.: "Concurrent Dual-band Digital Predistortion", Microwave Symposium Digest (MTT), 2012 IEEE MTT-SInternational, IEEE, Jun. 17, 2012 (Jun. 17, 2012), pp. 1-3, ISBN: 978-1-4673-1085-7, DOI: 10.1109/MWSYM.2012.6259532, XP032217048.

(Continued)

*Primary Examiner* — Fitwi Y Hailegiorgis
(74) *Attorney, Agent, or Firm* — 2SPL Patent Attorneys PartG mbB; Yong Beom Hwang

(57) ABSTRACT

A system and method for multi-band digital pre-distortion (DPD) for a non-linear system. The system includes a DPD circuitry configured to perform multi-band DPD on a multi-band input signal to compensate for a non-linearity of a non-linear system. The multi-band input signal includes input signals of multiple frequency bands and the DPD circuitry is configured to perform DPD on an input signal of each frequency band per frequency band. The DPD circuitry is configured to perform the DPD using a combination of a look-up table (LUT) that evaluates a non-linear function and computation of terms of a non-linear polynomial of one or more variables representing the input signals of multiple frequency bands. Both the non-linear function and the non-linear polynomial are in a reduced dimension lower than a dimension of the multi-band input signal.

15 Claims, 11 Drawing Sheets

(56) References Cited

OTHER PUBLICATIONS

Quindroit et al.: "FPGA Implementation of Orthogonal 2D Digital Predistortion System for Concurrent Dual-Band Power Amplifiers Based on Time-Division Multiplexing", IEEE Transactions on Microwave Theory and Techniques, IEEE, USA, vol. 61, No. 12, Dec. 1, 2013 (Dec. 1, 2013), pp. 4591-4599, ISSN: 0018-9480, DOI: 10.1109/TMTT.2013.2288220, XP011531946 [retrieved on Nov. 28, 2013].

Molina, Albert et al: "Concurrent Dual-Band Digital Predistortion Using 2-D Lookup Tables With Bilinear Interpolation and Extrapolation: Direct Least Squares Coefficient Adaptation", IEEE Transactions on Microwave Theory and Techniques, vol. 65, No. 4, Apr. 2017, pp. 1381-1393.

* cited by examiner

METHOD AND SYSTEM FOR MULTI-BAND DIGITAL PRE-DISTORTION USING A CANONICAL FORM WITH REDUCED DIMENSION LOOK-UP TABLE

FIELD

Examples relate to digital pre-distortion (DPD) for a non-linear system, more particularly a method and system for multi-band DPD using a reduced dimension look-up table (LUT).

BACKGROUND

DPD is an effective scheme to linearize a non-linear system, such as a power amplifier (PA). Multi-band DPD may be implemented where a single PA supports multiple different frequency bands by linearizing only around the fundamental frequencies and not around other intermodulation products of the fundamentals. The goal of the multi-band DPD is to improve adjacent channel leakage ratio (ACLR) in each band and does not need to compensate for intermodulation products, as these are rejected by a filter.

Multi-band DPD may be performed at high sampling rates (up to radio frequency (RF) sampling rates) or lower sampling rate using multi-dimensional algorithms. The latter requires using either polynomial models or alternatively multi-dimensional LUTs. Both of them grow exponentially in complexity with dimension and often become impractical for dimension sizes of three and above.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
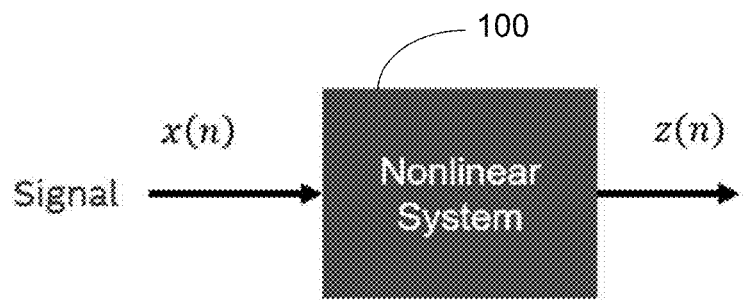
FIG. 1 shows a non-linear system.

FIG. 1 shows a non-linear system 100. The non-linear system 100 (e.g., a digital-to-analog converter (DAC), a power amplifier, etc.) receives an input signal x(n) and generate an output signal z(n). Due to the non-linear effects of the non-linear system 100, non-linear distortions such as harmonics and intermodulation may be present at the output signal z(n).

Figure 2:
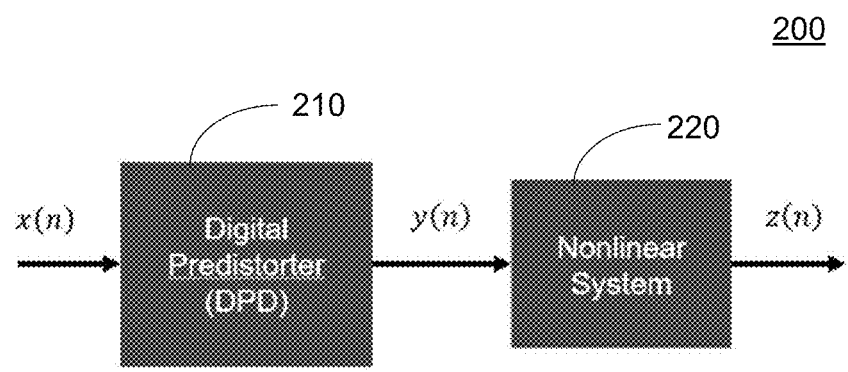
FIG. 2 shows an example system including DPD circuitry in front of a non-linear system for linearizing the non-linear system, in which aspects of the present application may be implemented.

FIG. 2 shows an example system 200 including DPD circuitry 210 in front of a non-linear system 220 for linearizing the non-linear system 220, in which aspects of the present application may be implemented. The non-linear system 220 may include a DAC, a power amplifier, or any other device having non-linear characteristics. In order to eliminate the unwanted distortion (such as harmonics and intermodulation) at the output of the non-linear system 220, DPD circuitry 210 is provided in front of the non-linear system 220. The DPD circuitry 210 receives an input signal x(n) and modifies the input signal to generate an output signal y(n). The DPD circuitry 210 may implement a mathematical model that produces an approximation of the inverse function of the non-linear system 220. By pre-distorting the input signal to the non-linear system 220 the non-linear effects of the non-linear system 220 can be compensated and the output of the non-linear system 220 may be linearized.

The non-linear system 220 may be modeled using polynomials or piece-wise polynomial functions to characterize the non-linear response of the system. The terms (e.g., polynomial terms) of the mathematical model for the DPD typically resemble that of the non-linearity with different parameters. Polynomial-based DPD systems receive input samples and applies the polynomial functions of the model to the input samples to generate pre-distorted DPD outputs. More specifically, the polynomial DPD systems may evaluate each of a set of polynomials given one or more input samples, apply the polynomial outputs as a non-linear gain factor to a function of the input samples, and sum the resulting samples to generate the DPD output. Assuming a suitable selection of modeling polynomials, the pre-distorted outputs may represent the inverse of the actual non-linearities of the non-linear system, which may be substantially canceled when the DPD outputs are applied as input to the non-linear system.

Polynomial-based DPD systems may either depend only on the current input sample (i.e., a memoryless polynomial model) or may depend on the current input sample in addition to one or more past input samples (i.e., a polynomial model with memory). The polynomial models with memory may present the DPD model as the sum of a plurality of terms, where each term is the product of a function of the current and/or previous input samples and a polynomial that is a function of the magnitude or power of the current or previous input samples. Accordingly, a DPD polynomial model with memory may evaluate each of a set of polynomials at one or more input samples, apply each polynomial output as a gain factor to a function of one or more input samples, and sum the resulting products to produce the overall DPD output.

A DPD polynomial model may need to evaluate each of the set of polynomials in order to produce each DPD output sample. In order to reduce computational burden, polynomial DPD systems may utilize one or more look-up tables (LUTs) to generate the DPD outputs. As opposed to directly evaluating each polynomial, DPD LUT systems may evaluate each of the polynomials over a wide range of input samples and may store the resulting outputs in a separate LUT. The LUT-based DPD systems may evaluate each LUT according to the received input samples and produce an LUT output value for each LUT. The LUT-based DPD systems may then produce the DPD output by applying the LUT output values as a set of gains to the corresponding function of input samples, thus avoiding direct evaluation of each polynomial.

The DPD system 210 may utilize adaptable LUTs that dynamically adjust the LUT coefficients for each LUT based on feedback from the output of the non-linear system 220. A DPD adaptation circuit (not shown) may perform adaptation of the LUT coefficients utilizing the feedback information derived from the output of the non-linear system 220. The DPD adaptation circuit may be a part of the DPD system 210. The DPD adaptation circuit may attempt to correct for any inaccuracies in the LUT coefficients that are observable through non-linearities detected in the output of the non-linear system 220. The DPD adaptation circuit may employ an adaptation scheme such as Least Squares (LS) based on either indirect or direct learning to adapt the LUT coefficients of the DPD system 210. Therefore, the DPD system 210 may dynamically adapt the LUT coefficients over time based on observations of the output of the non-linear system 220.

In examples disclosed herein, multi-band DPD is implemented for a non-linear system using a combination of a LUT that evaluates a non-linear function and computation of terms of a non-linear polynomial. The DPD circuitry 210 may be configured to perform multi-band DPD on a multi-band input signal to compensate for a non-linearity of a non-linear system. The multi-band input signal includes inputs signals of multiple frequency bands. The DPD circuitry 210 may perform DPD on an input signal of each frequency band per frequency band. The input signal of each frequency band is modified (pre-distorted) by the DPD circuitry 210, and the pre-distorted input signals of the multiple frequency bands may be combined at the output of the DPD circuitry 210. In examples, the DPD circuitry 210 is configured to perform the DPD using a combination of a LUT(s) that evaluates a non-linear function and computation of terms of a non-linear polynomial of one or more variables representing the input signals of the multiple frequency bands. Both the non-linear LUT function and the non-linear polynomial are in a reduced dimension lower than a dimension of the multi-band input signal, i.e., the dimension of the LUT and the polynomial is lower than a dimension of the multi-band input signal (i.e., the number of frequency bands in the multi-band signal). For example, for a three-band case, instead of using a 3D LUT, a combination of a reduced-dimension LUT (e.g., 2D or 1D LUT) and reduced polynomial terms (e.g., 2D or 1D) may be used for the DPD computation on each input signal. The DPD circuitry 210 may perform a 3D multi-band DPD using both a 2D LUT and computation of 1D polynomial terms. Alternatively, the DPD circuitry 210 may perform a 3D multi-band DPD using both 1D LUTs and computation of 2D polynomial terms.

The non-linear polynomial may be a linear combination of basis functions. Each basis function may be a symmetrical multi-dimensional polynomial taking, as input variables, a magnitude or power of input signals of frequency bands other than an input signal of a frequency band on which the DPD is performed.

In some trivial cases, some of the multi-dimensional polynomials are proportional to the magnitude of one of the bands. In this trivial case, use of look-up table is not needed.

In some examples, in order to reduce the size of the LUT, the non-linear polynomial may be decomposed to a canonical form. In still another example to reduce the size of the LUT, the entries of the LUT may be reduced or minimized (the LUT may have entries in a coarse granularity) and the DPD circuitry 210 may perform interpolation or extrapolation based on the entries of the LUT (e.g., two consecutive entries of the LUT).

Figure 3A:
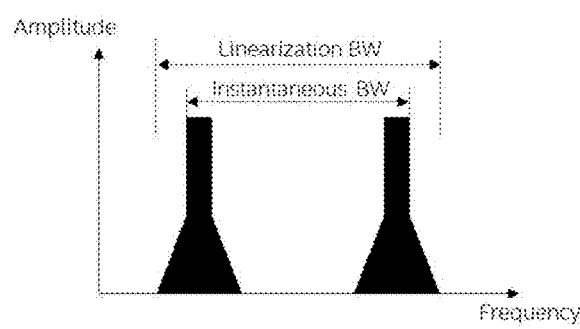
FIGS. 3A and 3B illustrate the wideband DPD and multi-band DPD schemes, respectively.
Figure 3B:
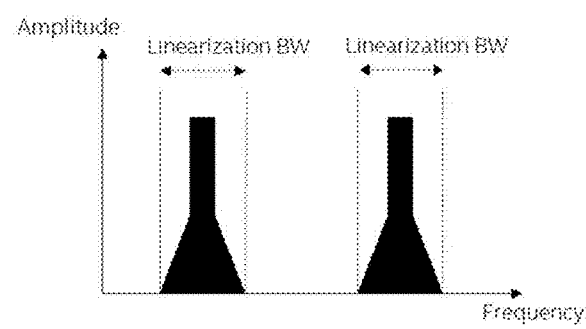

A multi-band DPD may be implemented either using a wide bandwidth and a high sampling rate DPD where the entire spectrum spanning all frequency bands is linearized (wideband DPD) or using a multi-band DPD model at a lower sampling rate where only spectrum within each band is linearized, and outside of each band is ignored (filtered by band filters). FIGS. 3A and 3B illustrate the wideband DPD and multi-band DPD schemes, respectively. In case of wideband DPD shown in FIG. 3A, the linearization bandwidth covers the instantaneous bandwidth (i.e., from the lower edge of the lowest carrier to the upper edge of the highest carrier) plus extra spectrum to cover the spectral regrowth around the transmitted RF carriers. In the multi-band DPD shown in FIG. 3B, the DPD scheme linearizes inside each frequency band. Assuming that the bandwidth of the carrier is relatively small compared to the instantaneous bandwidth this could result in a significant reduction in processing sample rate.

A numerical example is described for the dual-band illustration in FIGS. 3A and 3B in case where the instantaneous bandwidth is 1 GHz, each band contains a carrier of 200 MHz bandwidth, and spectral regrowth occurs up to fifth order intermodulation (IM5). The linearization bandwidth should be at least 1 GHz+(5×40 MHz−40 MHz)=1.16 GHz. Using the same numerical example, in the multi-band DPD case, each band may be corrected separately using multi-dimensional algorithm (band 2 interferes non-linearly with band 1 and vice versa). The linearization bandwidth is 40 MHz×5, a minimum sampling rate of 200 MSPS. There are two such bands processed simultaneously, resulting in 400 MSPS total sample throughput. That is almost ⅓ of the wideband algorithm. The larger the ratio of instantaneous bandwidth to carrier bandwidth, the larger the reduction in total sample rate using a multiband algorithm.

Figure 4:
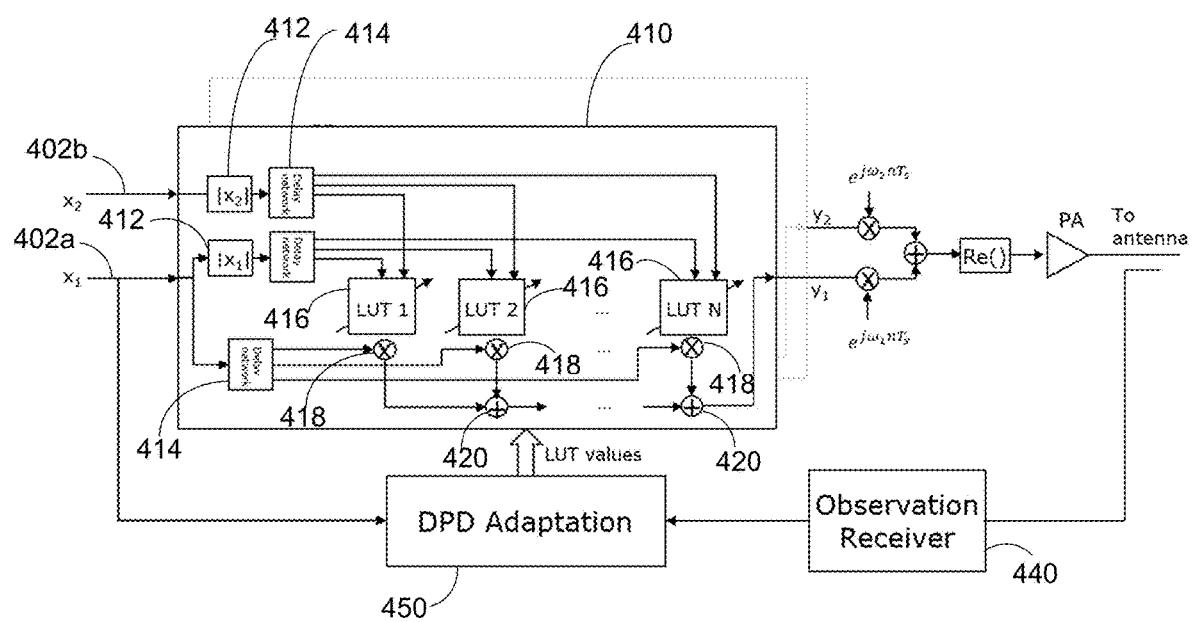
FIG. 4 is a diagram of a system for performing multi-band DPD using multi-dimensional LUTs.

FIG. 4 is a diagram of a system for performing multi-band DPD using multi-dimensional LUTs. FIG. 4 shows a two-band case as an example. The system includes a DPD circuitry 410. The input samples $x_1$ and $x_2$ 402a, 402b of the two frequency bands are received by the DPD circuitry 410. The DPD circuitry 410 includes 2D LUTs 416 in this example. In case of N frequency bands, N-dimensional LUTs may be used. The magnitude (or alternatively, the power) of the input signals $x_1$ and $x_2$ 402a, 402b are computed by the magnitude (or power) calculation units 412 and the magnitude (or power) values of the input samples of the two bands are used to address the 2D LUTs 416. Delay networks 414 are also provided to distribute the magnitude (power) values to the LUTs 416 and to synchronize the input signal 402a, 402b and the LUT outputs. The LUT outputs are multiplied by a multiplier 418 with the input sample 402a, 402b ($x_1$ or $x_2$), respectively, and summed by the summing network 420 to generate a DPD output $y_1$ and $y_2$, respectively. The (pre-distorted) DPD outputs on the two bands are further processed for transmission (e.g., mixed for up-conversion by a mixer, summed, and amplified by an amplifier and sent to antenna for transmission.) The transmit signal is tapped onto the observation receiver 440 as a feedback signal and the feedback signal is processed by the DPD adaptation circuitry 450 for updating the LUT values.

Figure 5:
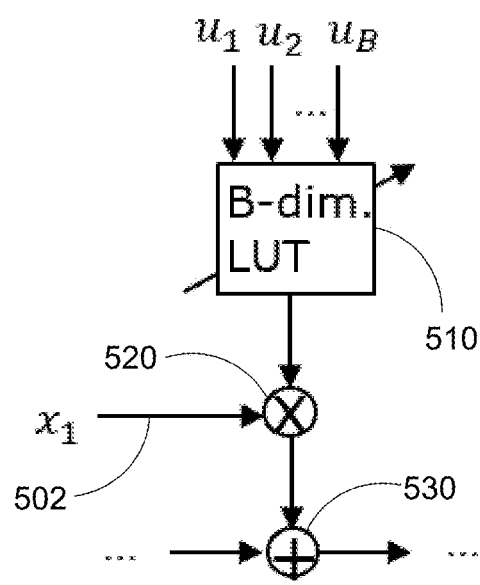
FIG. 5 shows a building block for performing DPD on band 1 ($x_1$) using a multi-dimensional LUT.

FIG. 5 shows a building block for performing DPD on band 1 ($x_1$) using a multi-dimensional LUT. For the multi-band signal with B bands, B-dimensional LUTs 510 may be used. B is the number of frequency bands. The magnitude (or power) ($u_1, u_2, \ldots, u_B$) of the input samples ($x_1, x_2, \ldots, x_B$) on multiple bands are used to address the B-dimensional LUT 510. $u_k=|x_k|^2$ or $|x_k|$. The LUT output value from the LUT 510 is multiplied by a multiplier 520 with each input signal 502 ($x_1$ in this example) and summed over the summing network 530 to generate the DPD output on each band.

The computation complexity of the multi-band DPD models grows exponentially with the number of bands, which often makes the implementation impractical. Multi-dimensional LUTs (e.g., two-dimensional (2D) or three-dimensional (3D) LUT) can be used to minimize computations. However, the memory size increases exponentially with the number of bands. For instance, a single 3D LUT, using only 16 entries per dimension will result in a memory size (16×16×16)×4 bytes=16 KB. Storing 24 such LUTs, with ping-pong tables to allow updating them during real-time operation, will result in a total memory requirement of 16K×24×2 ping-pong=768 KB. In addition, for such coarse table sizes (16 entries), linear interpolation in each dimension is required, resulting, for instance, in bi-linear or tri-linear interpolation which in a soft implementation on a soft radio platform, is performed on a vector processor in at least two or three iterations, wasting valuable processor cycles and lowering the computational performance.

In examples, in order to reduce the memory size and/or cycles due to linear interpolation/extrapolation operations, the multi-dimensional DPD may be implemented with a mix of polynomial computation and reduced dimension LUTs, i.e., a trade-off between polynomial computation and reduced dimension LUTs. For example, 3D polynomial computation may be implemented using 2D or 1D LUTs instead of 3D LUTs. In examples disclosed herein, a mix of polynomial computation and LUT-based DPD model is used to reduce the dimension of the LUTs (e.g., as low as 1D LUT). Alternatively or additionally, symmetries in the Generalized Memory Polynomial (GMP) model may be exploited to minimize the number of LUTs using a canonical decomposition as shown in Equation (7) below.

The LUT function (i.e., the non-linear gain computed as a multi-dimensional LUT) for multi-band DPD may be written as:

$$f(u_1, u_2, \ldots, u_B) = \Sigma_{k_1, k_2, \ldots, k_B} a_{k_1, k_2, \ldots, k_B} u_1^{k_1} u_2^{k_2} \ldots u_B^{k_B}, \quad \text{Equation (1)}$$

where B is the number of frequency bands, and $u_k=|x_k|^2$ or $|x_k|$ where $x_k$ is input samples on band k. In an example for three bands, the 3D LUT function may be written as:

$$f(u,v,w) = \Sigma_{i,j,k} a_{i,j,k} u^i v^j w^k. \quad \text{Equation (2)}$$

The 3D polynomial function may be expressed as 2D LUTs and 1D polynomial terms as follows:

$$f(u,v,w) = \Sigma_k w^k (\Sigma_{i,j} a_{i,j,k} u^i v^j), \quad \text{Equation (3)}$$

$$f(u,v,w) = \Sigma_k w^k g_k(u,v), \quad \text{Equation (4)}$$

where $g_k(u,v)$ may be implemented with 2D LUTs.

Alternatively, the 3D polynomial function may be expressed as 1D LUTs and 2D polynomial terms as follows:

$$f(u,v,w) = \Sigma_{j,k} v^j w^k (\Sigma_i a_{i,j,k} u^i), \quad \text{Equation (5)}$$

$$f(u,v,w) = \Sigma_{j,k} v^j w^k g_{j,k}(u), \quad \text{Equation (6)}$$

wherein $g_k(u)$ may be implemented with 1D LUTs.

Figure 6:
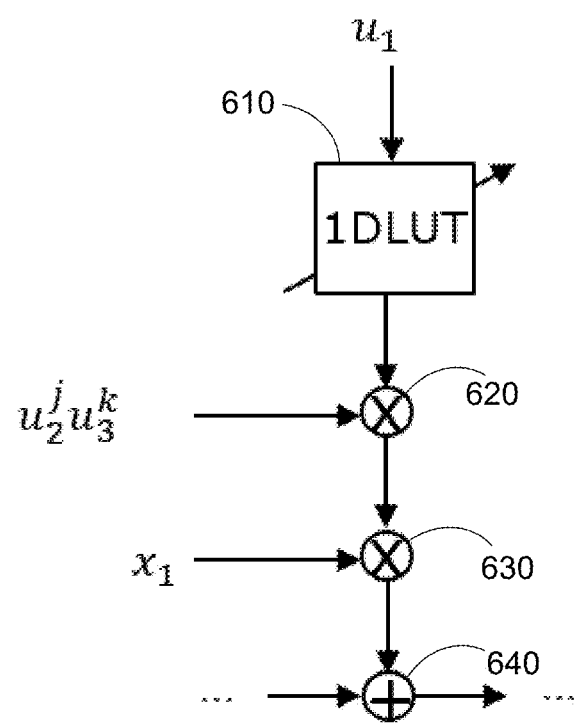
FIG. 6 shows an example building block for performing DPD on band 1 among three bands using one-dimensional (1D) LUTs in accordance with one example.

FIG. 6 shows an example building block for performing DPD on band 1 ($x_1$) among three bands using 1D LUTs in accordance with one example. The magnitude (or power) of the input sample on band 1 ($x_1$) is used to address the 1D LUT 610. $u_k=|x_k|^2$ or $|x_k|$ where k=1,2,3. The LUT output value from the LUT 610 is multiplied by a multiplier 620 with the 2D polynomial terms $u_2^j u_3^k$, and then multiplied by a multiplier 630 to the input signal ($x_1$ in this example) and summed over the summing network 640 to generate the DPD output on band 1. The same processing is performed for band 2 and 3 input samples.

Figure 7:
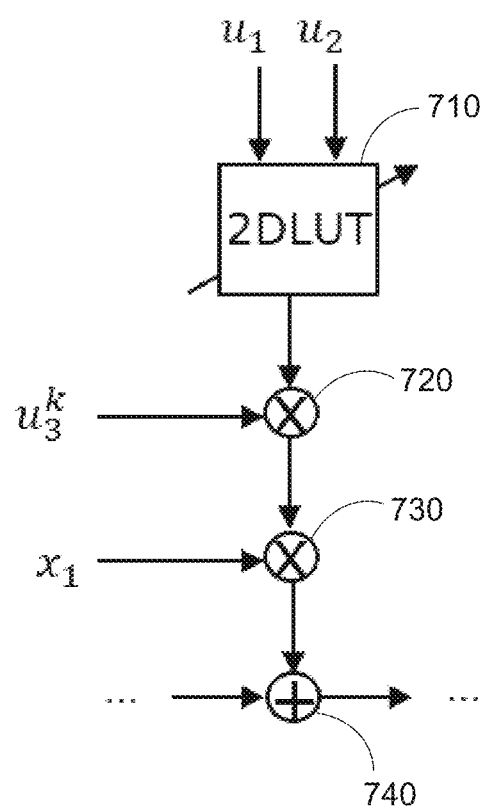
FIG. 7 shows a building block for performing DPD on band 1 among three bands using two-dimensional (2D) LUTs in accordance with another example.

FIG. 7 shows a building block for performing DPD on band 1 ($x_1$) among three bands using 2D LUTs in accordance with another example. The magnitude (or power) of the input signal on bands 1 and 2 (or bands 1 and 3) is used to address the 2D LUT 710. $u_k=|x_k|^2$ or $|x_k|$, where k=1,2,3. The LUT output value from the LUT 710 is multiplied by a multiplier 720 with the 1D polynomial terms $u_3^k$ (or $u_2^j$), and then multiplied by a multiplier 730 to the input signal ($x_1$ in this example) and summed over the summing network 740 to generate the DPD output on band 1. The same processing is performed for band 2 and 3.

Performing the multi-band DPD using 1D LUTs have a problem of needing too many 1D LUTs. Therefore, in some examples, it can be further simplified by exploiting symmetries to minimize the number of LUTs using a canonical decomposition. Equation (6) can be written in a canonical form as follows;

$$f(u,v,w) = \Sigma_{i,j}(v+w)^i(vw)^j g_{i,j}(u),\qquad \text{Equation (7)}$$

where $g_k(u)$ may be implemented with 1D LUTs.

For a multi-dimensional polynomial order 7, this canonical form would need 6 terms, i.e., four 1D LUTs and 2 gain terms. For brute force implementation in FIG. 6 would need sixteen (16) 1D LUTs (4 powers for v and 4 powers for w). The canonical form would have 4 times of reduction in number of LUTs compared to the brute force implementation.

Figure 8:
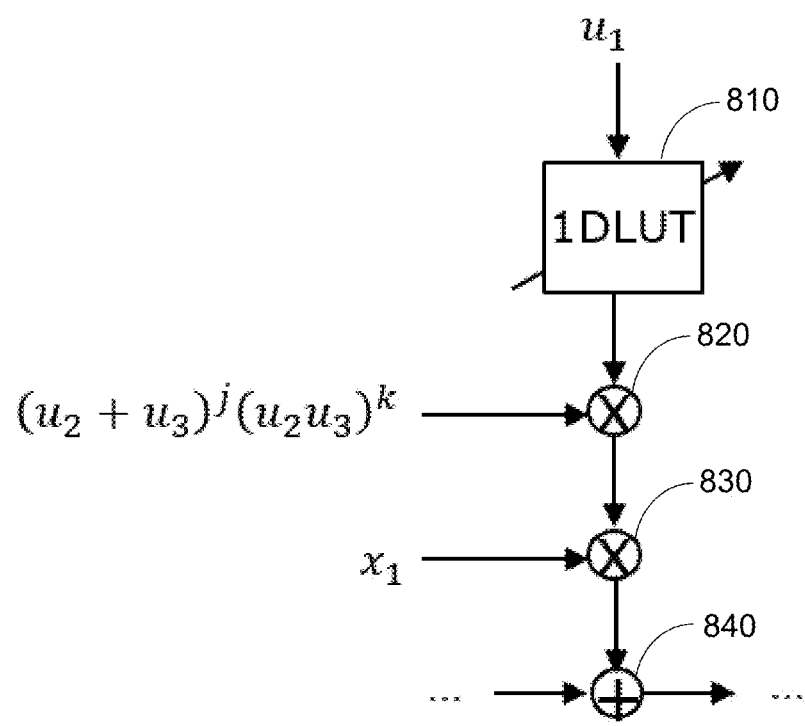
FIG. 8 shows an example building block for performing DPD on band 1 using a reduced-dimension LUT in accordance with another example.

FIG. 8 shows an example building block for performing DPD on band 1 using a reduced-dimension LUT in accordance with another example. The magnitude (or power) of the signal on band 1 ($x_1$) is used to address the 1D LUT 810. $u_1 = |x_1|^2$ or $|x_1|$. The LUT output value from the LUT is multiplied by a multiplier 820 with the polynomial terms $(u_2+u_3)^j(u_2 u_3)^k$, and then multiplied by a multiplier 830 to the input signal ($x_1$ in this example) and summed over the summing network 840 to generate the DPD output on band 1. The same processing is performed for band 2 and 3.

FIGS. 6-8 show the examples of three bands case. However, it should be noted that the examples are applicable to any number of frequency bands.

Figure 9:
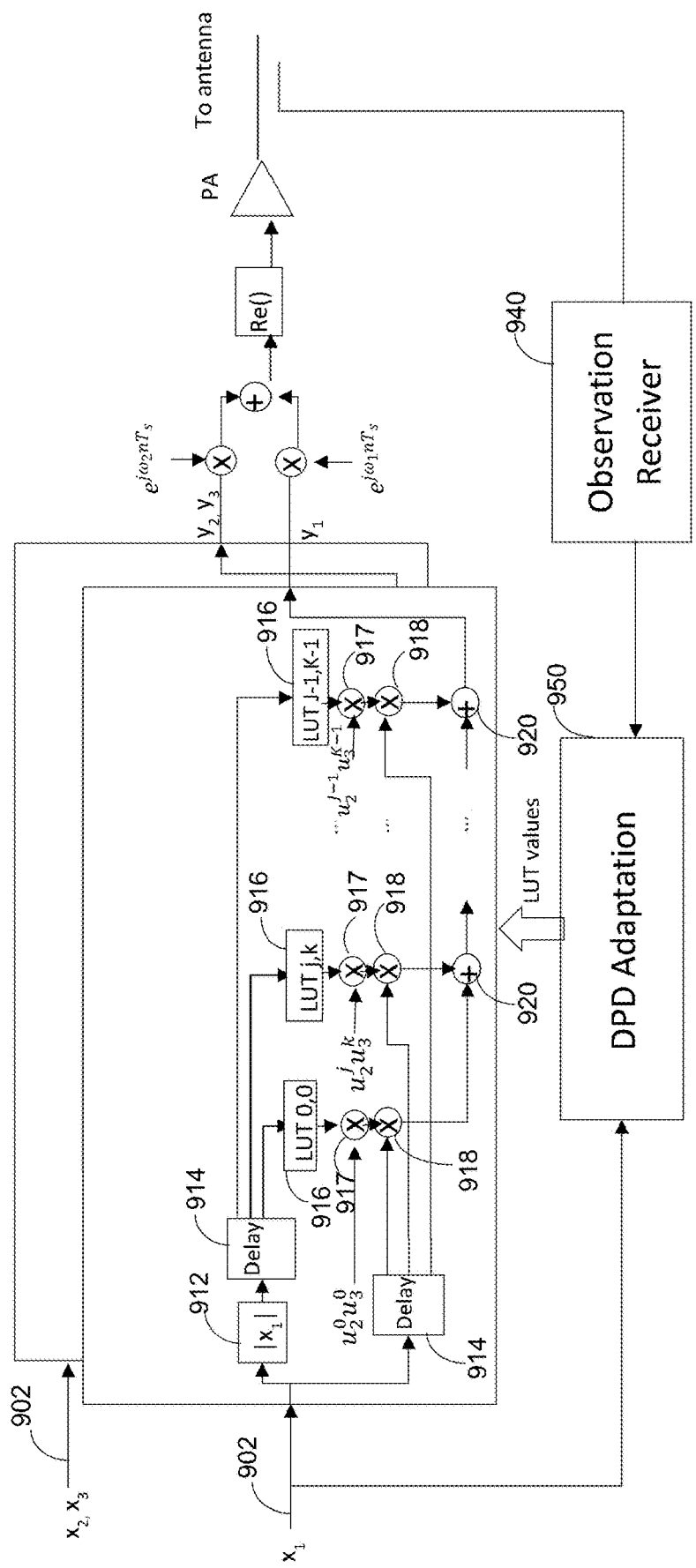
FIG. 9 is a diagram of an example system for performing multi-band DPD using a combination of reduced-dimension LUTs and computation of reduced-dimension polynomial terms in accordance with one example.

FIG. 9 is a diagram of an example system for performing multi-band DPD using a combination of reduced-dimension LUTs and computation of reduced-dimension polynomial terms in accordance with one example. FIG. 9 shows a three-band case as an example, but it can be applied to any dimension multi-band DPD. The system 900 includes a DPD circuitry 910. The input samples 902 $x_1$, $x_2$, $x_3$ of the three frequency bands are received by the DPD circuitry 910. The DPD circuitry 910 includes LUTs 916 (e.g., 1D LUTs). The magnitude (or power) of the input signals 902 are computed by the magnitude (or power) calculation units 912 and the magnitude (or power) values of the input samples are used to address the LUTs 916. Delay networks 914 are provided to distribute the magnitude (power) values to the LUTs 916 and to synchronize the input signal 902 and the LUT outputs. The LUT outputs are multiplied by a multiplier 917 with the polynomial terms (e.g., as in Equations (4), (6), or (7)), and then multiplied by a multiplier 918 with the input sample 902 ($x_1$, $x_2$, $x_3$), respectively, and summed by the summing network 920 to generate a DPD output $y_1$, $y_2$, $y_3$, respectively. The (pre-distorted) DPD outputs on the multiple bands (three in this example) are further processed for transmission (e.g., mixed for up-conversion by a mixer, summed, and amplified by an amplifier and sent to antenna for transmission.) The transmit signal may be tapped onto the observation receiver 940 as a feedback signal and the feedback signal is processed by the DPD adaptation circuitry 950 for updating the LUT values.

A multi-band radio frequency (RF) signal x is a real signal given by the sum of the RF signals of B bands:

$$x_n = 2\,\text{Re}(\Sigma_{1\le b \le B} x_{b,n}) = \Sigma_{1\le b \le B}(x_{b,n}+x_{b,n}^*),\qquad \text{Equation (8)}$$

where B is the number of bands.

The RF signal for band b is given by (continuous time signal):

$$x_b(t) = x_b^{BB}(t) e^{j\omega_b t},\qquad \text{Equation (9)}$$

where BB refers to baseband. The discrete time version of the RF signal for band b is (sampling period $T_s$):

$$x_{b,n} = x_{b,n}^{BB} e^{j\omega_b n T_s}\qquad \text{Equation (10)}$$

In the following analysis, for the multi-band GMP model, without loss of generality, the derivations for band 1 and the case of the number of bands B=2 will be analyzed. However, it should be noted that it can be easily extended to the case of B>2 by noticing that terms with $x_2$ (i.e., bands other than 1) can be interchanged with each other due to symmetry resulting in similar terms.

First, a simple static model (polynomial with no memory) is considered. The time index n is removed to simplify the notation. The static model is written as:

$$y = \Sigma_p \alpha_p x^p.\qquad \text{Equation (11)}$$

Using the multi-nominal expression, $$x^p = (x_1 + \ldots + x_B)^p = \sum_{k_1+\ldots+k_B=p} \binom{p}{k_1,\ldots,k_B} x_1^{k_1} \ldots x_B^{k_B} = \sum_{k_1+\ldots+k_B=p} \frac{p!}{k_1!\ldots k_B!} x_1^{k_1} \ldots x_B^{k_B}.\qquad \text{Equation (12)}$$

Substituting $x_i$ (i=1, ..., B) in Equation (12) with $x_i+x_i^*$:

$$x^p = \sum_{k_1+\ldots+k_B=p} \sum_{i_1=0}^{k_1} \ldots \sum_{i_B=0}^{k_B} \binom{p}{k_1,\ldots,k_B}\binom{k_1}{i_1}\ldots\binom{k_B}{i_B} x_1^{i_1} x_1^{*k_1-i_1} \ldots x_B^{i_B} x_B^{*k_B-i_B}.\qquad \text{Equation (13)}$$

Many of the terms above produce frequency components outside of the band 1. Terms with $e^{j\omega_1 t}$ need to satisfy:

$$i_1 = k_1 - i_1 + 1,\ i_2 = k_2 - i_2,\ \ldots,\ i_B = k_B - i_B,$$

$$\rightarrow i_1 = \frac{k_1+1}{2},\ i_2 = \frac{k_2}{2},\ \ldots,\ i_B = \frac{k_B}{2}.$$

This means that $k_2$ to $k_B$ are even (can be substituted with $2k_i$, $i \ne 1$) and $k_1$ is odd (can be substituted with $2k_1+1$). This means that the sum p is odd (can be substituted with 2p+1).

$$x^{2p+1} = \sum_{2k_1+1+2k_2+\ldots+2k_B=2p+1} \binom{2p+1}{2k_1+1,\ldots,2k_B}\binom{2k_1+1}{k_1}\ldots\binom{2k_B}{k_B}|x_1|^{2k_1}\ldots|x_B|^{2k_B} x_1.\qquad \text{Equation (14)}$$

Let $u_i = |x_i|^2$. The above expression becomes:

$$x^{2p+1} = \left(\sum_{k_1+\ldots+k_B=p}\binom{2p+1}{2k_1+1,\ldots,2k_B}\binom{2k_1+1}{k_1}\ldots\binom{2k_B}{k_B} u_1^{k_1} \ldots u_B^{k_B}\right) x_1.\qquad \text{Equation (15)}$$

The non-linear gain in front of $x_1$ simplifies and becomes:

$$\sum_{k_1+\ldots+k_B=p} \binom{2p+1}{2k_1+1,\ldots,2k_B} \binom{2k_1+1}{k_1} \cdots \binom{2k_B}{k_B} u_1^{k_1} \cdots u_B^{k_B}. \quad \text{Equation (16)}$$

$$\binom{2p+1}{2k_1+1,\ldots,2k_B}\binom{2k_1+1}{k_1} \cdots \binom{2k_B}{k_B} = \quad \text{Equation (17)}$$

$$\frac{(2p+1)!}{(k_1+1)!\ldots(k_B!)} \cdot \frac{(2k_1+1)!}{(k_1+1)!k_1!} \cdots \frac{(2k_B)!}{k_B!k_B!} =$$

$$\frac{(2p+1)!}{(k_1+1)!(k_2!\ldots k_B!)^2}.$$

Let $$a_{2p+1,k_1,k_2,\ldots,k_B} = \frac{(2p+1)!}{(k_1+1)!k_1!(k_2!\ldots k_B!)^2}.$$

$$x^{2p+1} = f^{(2p+1)}(u_1, u_2, \ldots, u_B)x_1, \quad \text{Equation (18)}$$

where $f^{(2p+1)}(u_1, u_2, \ldots, u_B) = \sum_{k_1+\ldots+k_B=p} \alpha_{2p+1,k_1,\ldots,k_B} u_1^{k_1} \cdots u_B^{k_B}$.

If $j_2, \ldots, j_B$ is a permutation of $i_2, \ldots, i_B$, then:

$$a_{k_1,i_2,\ldots,i_B} = a_{k_1,j_2,\ldots,j_B}. \quad \text{Equation (19)}$$

For the non-linear model of DPD for band 1, $$y_1 = \sum_p \alpha_{2p+1} x^{2p+1} = (\sum_p \alpha_{2p+1} f^{(2p+1)}(u_1, u_2, \ldots, u_B))x_1 = f(u_1, u_2, \ldots, u_B)x_1, \quad \text{Equation (20)}$$

where $$f(u_1, u_2, \ldots, u_B) = \sum_p \alpha_{2p+1} f^{(2p+1)}(u_1, u_2, \ldots, u_B),$$

$$f^{(2p+1)}(u_1, u_2, \ldots, u_B) = \sum_{k_1+\ldots+k_B=p} a_{2p+1,k_1,\ldots,k_B} u_1^{k_1} \cdots u_B^{k_B}, \text{ and}$$

$$a_{2p+1,k_1,k_2,\ldots,k_B} = \frac{(2p+1)!}{(k_1+1)!k_1!(k_2!\ldots k_B!)^2}.$$

The case of a DPD model with memory is considered. In the wideband memory polynomial model, the DPD output y is given by the DPD real input signal x (sampled at RF-sampling rate):

$$y_n = \sum_m \sum_p \alpha_{m,p} x_{n-m}^p. \quad \text{Equation (21)}$$

Using the above analysis, $$y_n = \sum_m f_m(u_1, u_2, \ldots, u_B) x_{1,n-m}, \quad \text{Equation (22)}$$

where $$f_m(u_1, u_2, \ldots, u_B) = \sum_p \alpha_{m,2p+1} f^{(2p+1)}(u_1, u_2, \ldots, u_B),$$

$$f^{(2p+1)}(u_1, u_2, \ldots, u_B) = \sum_{k_1+\ldots+k_B=p} a_{2p+1,k_1,\ldots,k_B} u_1^{k_1} \cdots u_B^{k_B},$$

$$a_{2p+1,k_1,\ldots,k_B} = \frac{(2p+1)!}{(k_1+1)!k_1!(k_2!\ldots k_B!)^2}.$$

For triple bands, or higher number of bands, one concern is that the intermodulation of two bands could overlap with another byand. In the case of tri-band signal, terms like $e^{j(r\omega_2+s\omega_3)t}$ are considered.

Consider a numerical example of r=5, s=−3. This means that there are terms like:

$$f(|x_{1,n-l}|^2, |x_{2,n-l}|^2, |x_{3,n-l}|^2) x_{2,n-l}^5 x_{3,n}^{*3}, \quad \text{Equation (23)}$$

where $f(\cdot)$ is of the form:

$$f(|x_{1,n-l}|^2, |x_{2,n-l}|^2, |x_{3,n-l}|^2) = \quad \text{Equation (24)}$$

$$\sum_{k_1,k_2,k_3} a_{k_1,k_2,k_3} |x_{1,n-p}|^{2k_1} |x_{2,n-p}|^{2k_2} |x_{3,n-p}|^{2k_3}.$$

The GMP model can be expressed in terms of multi-dimensional functions as:

$$f(u_1, u_2, \ldots, u_B) = \sum_{k_1,k_2,\ldots,k_B} a_{k_1,k_2,\ldots,k_B} u^{k_1} u^{k_2} \cdots u^{k_B}, \quad \text{Equation (25)}$$

where $u_k = |x_k|^2$.

These functions can be computed using a multi-dimensional LUT with multi-linear interpolation. The look-up table size grows exponentially with the dimension size. In examples, to reduce the memory size, a trade-off may be made between direct computation of polynomial terms and LUTs. Consider an example of three bands (i.e., B=3):

$$f(u,v,w) = \sum_{i,j,k} a_{i,j,k} u^i v^j w^k. \quad \text{Equation (26)}$$

$$f(u,v,w) = \sum_k w^k (\sum_{i,j} a_{i,j,k} u^i v^j) \Rightarrow f(u,v,w) = \sum_k w^k g_k(u,v). \quad \text{Equation (27)}$$

In this form, the 3D function can be computed using a mix of polynomial terms $w^k$ and 2D look-up tables $g_k(u,v)$. The 3D function can also be written:

$$f(u,v,w) = \sum_{j,k} v^j w^k (\sum_i a_{i,j,k} u^i), \quad \text{Equation (28)}$$

$$f(u,v,w) = \sum_{j,k} v^j w^k g_{j,k}(u). \quad \text{Equation (29)}$$

In this form, the 3D non-linear function can be computed using a mix of polynomial terms $v^j w^k$ and 1D look-up tables $g_{j,k}(u)$. As dimension size increases the number of 1D LUTs increases exponentially. To reduce the number of LUTs it is possible to further exploit symmetries to reduce the number of terms in the above sum, and hence the number of look-up tables.

This scheme is explained with the above example.

$$y = \sum_p \alpha_{2p} y_{2p} x_1, \quad \text{Equation (30)}$$

$$y_{2p} = x^{2p} = \sum_{k_1+k_2+k_3=p} a_{2p+1,k_1,k_2,k_3} u^{k_1} v^{k_2} w^{k_3}, \quad \text{Equation (31)}$$

where $$a_{2p+1,k_1,k_2,k_3} = \frac{(2p+1)!}{(k_1+1)!k_1!(k_2!k_3!)^2}.$$

The third order terms (p=1):

$$a_{3,k_1,k_2,k_3} = \frac{3!}{k_1!(k_1+1)!(k_2!k_3!)^2},$$

$$a_{3,1,0,0} = \frac{3!}{1!\,2!\,(1)^2} = 3,$$

$$a_{3,0,1,0} = a_{3,0,0,1} = \frac{3!}{1!\,(1)^2} = 6,$$

$$y_2 = 3u + 6v + 6w = 3u + 6(v+w).$$

$$a_{5,2,0,0} = \frac{5!}{2!\,3!\,(1)^2} = 10,$$

$$a_{5,0,2,0} = a_{5,0,0,2} = \frac{5!}{(2)^2} = 30,$$

$$a_{5,1,1,0} = a_{5,1,0,1} = \frac{5!}{1!\,2!\,(1)^2} = 60,$$

$$a_{5,0,1,1} = \frac{5!}{0!\,1!\,(1)^2} = 120,$$

$$y_4 = (10u^2) + (v+w)(60u) + (v+w)^2(30) + vw(60),$$

$$y_4 = 10u^2 + 30(v^2+w^2) + 60u(v+w) + 120vw =$$

$$10u^2 + 30((v+w)^2 - 2vw) + 60u(v+w) + 120vw.$$

The fifth order terms (p=2):

$$a_{7,3,0,0} = \frac{7!}{3!\,4!\,(1)^2} = 10,$$

$$a_{7,0,3,0} = a_{7,0,0,3} = \frac{7!}{(3!)^2} = 140,$$

$$a_{7,2,1,0} = a_{7,2,0,1} = \frac{7!}{2!\,3!\,(1)^2} = 420,$$

$$a_{7,1,2,0} = a_{7,1,0,2} = \frac{7!}{1!\,2!\,(2!)^2} = 630,$$

$$a_{7,0,2,1} = a_{7,0,1,2} = \frac{7!}{0!\,1!\,(2!)^2} = 1260,$$

$$a_{7,1,1,1} = \frac{7!}{1!\,2!\,(1)^2} = 2520.$$

The symmetry between v and w can be used to find a canonical decomposition as follows:

$y_6 = 35u^3 + 140(v^3+w^3) + 420(u^2v+u^2w) + 630(uv^2+uw^2) + 1260(v^2w+vw^2) + 2520uvw,$ $y_6 = 35u^3 + 140((v+w)^3 - 3v^2w - 3vw^2) + 420u^2(v+w) + 630u((v+w)^2 - 2vw) + 1260vw(v+w) + 2520uvw,$ $y_6 = 35u^3 + 140(v+w)^3 + 420u^2(v+w) + 630u(v+w)^2 + 840vw(v+w) + 1260uvw,$ $y_6 = (35u^3) + (v+w)(420u^2) + (v+w)^2(630u) + (v+w)^3(140) + vw(1260u) + vw(v+w)(840).$ The non-linear gain for the tri-band signal (static DPD model) is given by:

$f(u,v,w) = \alpha_0 + \alpha_2 y_2 + \alpha_4 y_4 + \alpha_6 y_6,$ $f(u,v,w) = \alpha_0 + \alpha_2(3u + 6(v+w)) + \alpha_4((10u^2) + (v+w)(60u) + (v+w)^2(30) + vw(60)) + \alpha_6((35u^3) + (v+w)(420u^2) + (v+w)^2(630u) + (v+w)^3(140) + vw(1260u) + vw(v+w)(840)).$ Which further simplifies to:

$f(u,v,w) = (\alpha_0 + 3\alpha_2 u + 10\alpha_4 u^2 + 35\alpha_6 u^3) + (v+w)(6\alpha_2 + 60\alpha_4 u + 420\alpha_6 u^2) + (v+w)^2(30\alpha_4 + 630\alpha_6 u) + (v+w)^3(140\alpha_6) + vw(60\alpha_4 + 1260\alpha_6 u) + vw(v+w)(840\alpha_6).$ In this example, the following 6 terms (4 1D LUTs) can be found.

$f(u,v,w) = \Sigma_{i,j} \Sigma_{i,j}(v+w)^i (v_w)^j g_{i,j}(u),$ $g_{0,0}(u) = \alpha_0 + 3\alpha_2 u + 10\alpha_4 u^2 + 35\alpha_6 u^3,$ $g_{1,0}(u) = 6\alpha_2 + 60\alpha_4 u + 420\alpha_6 u^2,$ $g_{2,0}(u) = 30\alpha_4 + 630\alpha_6 u,$ $g_{3,0}(u) = 140\alpha_6,$ $g_{0,1}(u) = 60\alpha_4 + 1260\alpha_6 u,$ $g_{1,1}(u) = 840\alpha_6.$ The simplistic method can also be used.

$f(u,v,w) = \Sigma_{i,j} v^i w^j g_{i,j}(u),$ where i and j can each take 4 values, leading to 16 possible combinations or 16 1D LUTs.

In the above example, the above canonical form greatly reduces the number of LUTs from 16 to 6, by only introducing an extra add (v+w) and one extra multiplication (vw).

For the general case of dimension B bands, the basis functions may be defined as:

$$X_l = \Sigma_{(p_1,\ldots,p_{B-1}) \in \Pi(O(l),Z(l))} u_p^{p_1} \ldots u_{B-1}^{p_{B-1}},$$

where $O(l) = (1,\ldots,1)$ (1 element vector), $Z(l) = (0,\ldots,0)$ (B−1−l element vector), B is the number of bands, the function H denotes a set of permutations: $H(k_1,\ldots,k_M)$, the set of all unique permutations of $k_1,\ldots,kM$.

Some examples for M=3:

$\Pi(7,0,0) = \{(7,0,0),(0,7,0),(0,0,7)\},$ $\Pi(5,1,1) = \{(5,1,1),(1,5,1),(1,1,5)\}$ $\Pi(5,2,0) = \{(5,2,0),(5,0,2),(2,5,0),(0,5,2),(2,0,5),(0,2,5)\},$ $H(2,2,2) = \{(2,2,2)\}.$

In the general case, it can be shown (by exploiting symmetries) that a more general expression of the canonical form can be obtained as:

$$f(u_1,\ldots,u_B) = \Sigma_{l_1,\ldots,l_{B-1}} X_1^{l_1} \ldots X_{B-1}^{l_{B-1}} g_{l_1,\ldots,l_{B-1}}(u_1).$$ Equation ( )

The basis functions $X_l$ have a power 2l. Therefore, for DPD of order up to 2K+1, $l_1 + 2l_2 + \ldots + (B-1)l_{B-1} \leq K$. The number of 1D LUTs for different number of bands is given by Table 1 (for K=3 i.e., DPD up to seventh order non-linearity).

TABLE 1

| B = 2 | B = 3 | B = 4 | B > 4 |
|---|---|---|---|
| $l_1 \leq K$ | $l_1 + 2l_2 \leq K$ | $l_1 + 2l_2 + 3l_3 \leq K$ | $l_1 + 2l_2 + 3l_3 \leq K$ and $l_q = 0$ for q > 3 |
| $l_1$ | $l_1, l_2$ | $l_1, l_2, l_3$ | $l_1, l_2, l_3, l_4 = \ldots = l_{B-1} = 0$ |
| 0 | 0 0 | 0 0 0 | 0 0 0 0 ... 0 |
| 1 | 0 1 | 0 0 1 | 0 0 1 0 ... 0 |
| 2 | 1 0 | 0 1 0 | 0 1 0 0 ... 0 |
| 3 | 1 1 | 1 0 0 | 1 0 0 0 ... 0 |
|  | 2 0 | 1 1 0 | 1 1 0 0 ... 0 |
|  | 3 0 | 2 0 0 | 2 0 0 0 ... 0 |
|  |  | 3 0 0 | 3 0 0 0 ... 0 |
| $N_{1DLUT} = 4$ | $N_{1DLUT} = 6$ | $N_{1DLUT} = 7$ | $N_{1DLUT} = 7$ |

For a given polynomial power, the number of look-up tables does not grow indefinitely with number of bands. For seventh order non-linearity, the number of 1D LUT plateaus at 7 as number of bands increases.

Figure 10:
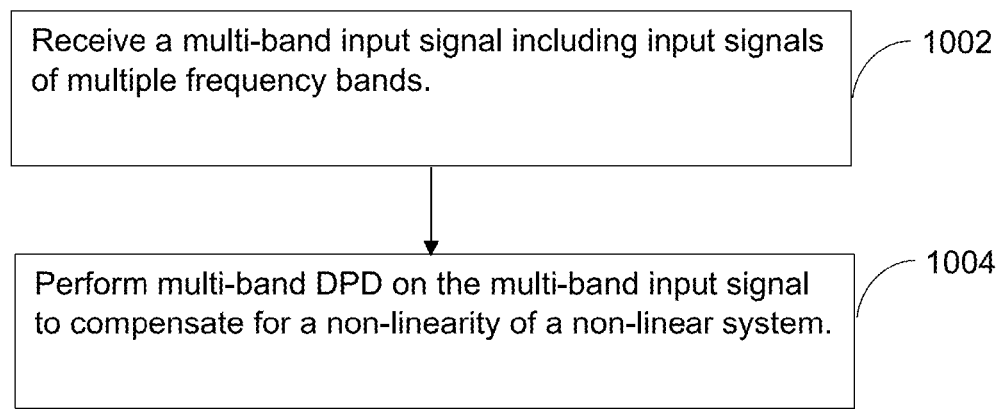
FIG. 10 is a flow diagram of a example process for multi-band DPD for a non-linear system.

FIG. 10 is a flow diagram of a example process for multi-band DPD for a non-linear system. A multi-band input signal including input signals of multiple frequency bands is received (1002). Multi-band DPD is performed on the multi-band input signal to compensate for a non-linearity of a non-linear system (1004). DPD is performed on an input signal of each frequency band per frequency band. The DPD is performed using a combination of a LUT that evaluates a non-linear function and computation of terms of a non-linear polynomial of one or more variables representing the input signals of multiple frequency bands, wherein both the non-linear function and the non-linear polynomial are in a reduced dimension lower than a dimension of the multi-band input signal.

Figure 11:
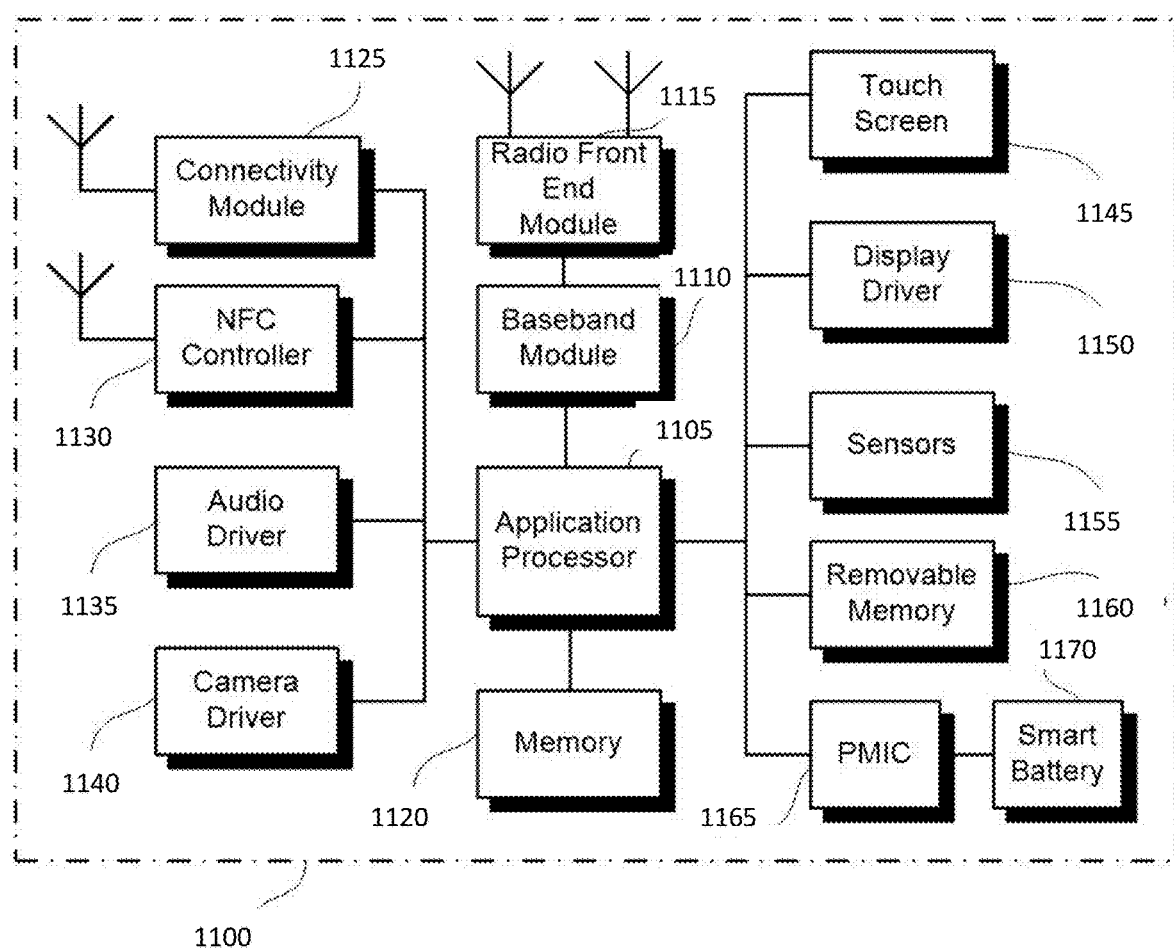
FIG. 11 illustrates a user device in which the examples disclosed herein may be implemented.

FIG. 11 illustrates a user device 1100 in which the examples disclosed herein may be implemented. For example, the examples disclosed herein may be implemented in the radio front-end module 1115, in the baseband module 1110, etc. The user device 1100 may be a mobile device in some aspects and includes an application processor 1105, baseband processor 1110 (also referred to as a baseband module), radio front end module (RFEM) 1115, memory 1120, connectivity module 1125, near field communication (NFC) controller 1130, audio driver 1135, camera driver 1140, touch screen 1145, display driver 1150, sensors 1155, removable memory 1160, power management integrated circuit (PMIC) 1165 and smart battery 1170.

In some aspects, application processor 1105 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1110 may be implemented, for example, as a solder-down substrate including one or more integrated circuits, a single packaged integrated circuit soldered to a main circuit board, and/or a multi-chip module containing two or more integrated circuits.

Figure 12:
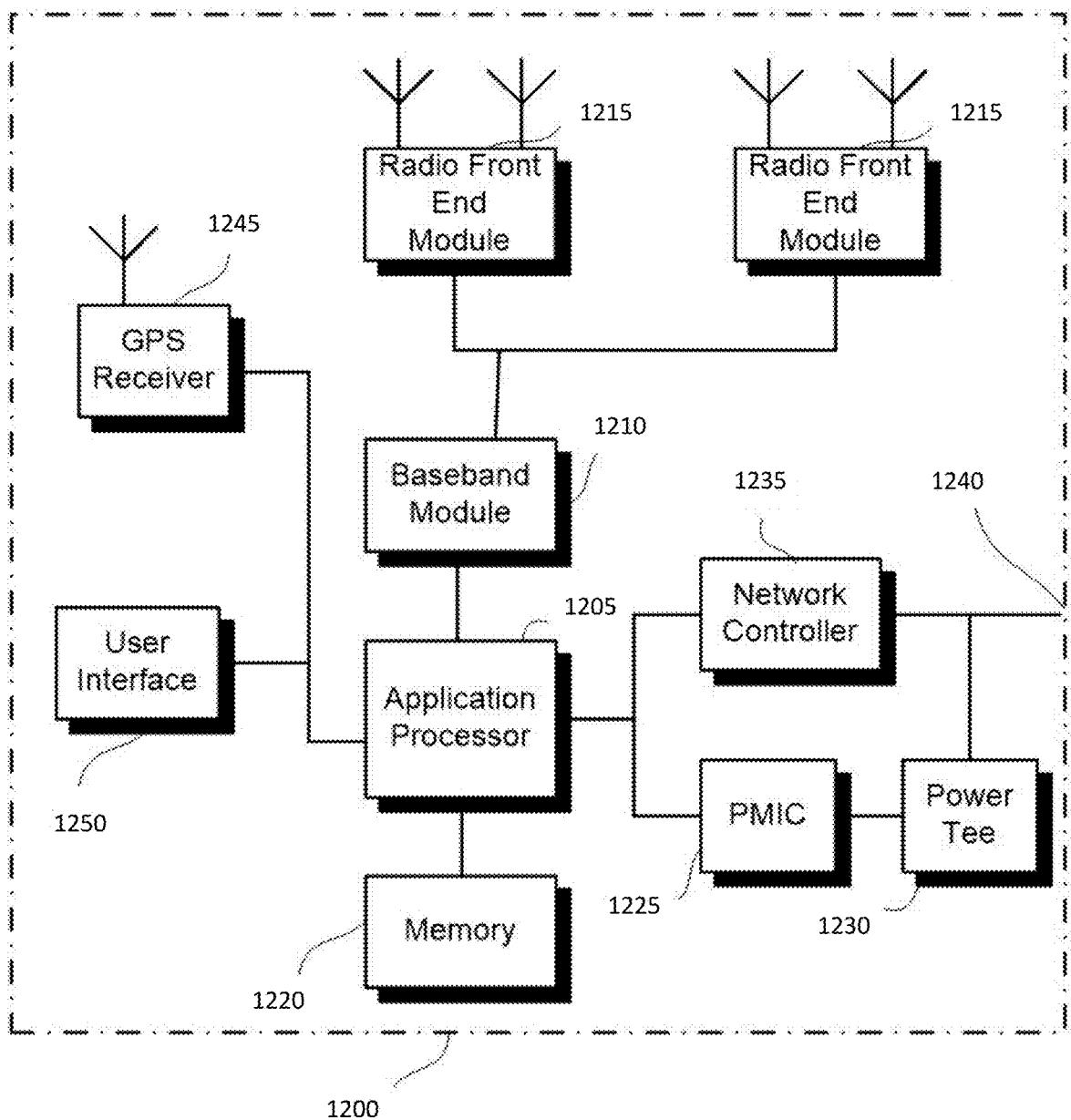
FIG. 12 illustrates a base station or infrastructure equipment radio head in which the examples disclosed herein may be implemented.

FIG. 12 illustrates a base station or infrastructure equipment radio head 1200 in which the examples disclosed herein may be implemented. For example, the examples disclosed herein may be implemented in the radio front-end module 1215, in the baseband module 1210, etc. The base station radio head 1200 may include one or more of application processor 1205, baseband modules 1210, one or more radio front end modules 1215, memory 1220, power management circuitry 1225, power tee circuitry 1230, network controller 1235, network interface connector 1240, satellite navigation receiver module 1245, and user interface 1250.

In some aspects, application processor 1205 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1210 may be implemented, for example, as a solder-down substrate including one or more integrated circuits, a single packaged integrated circuit soldered to a main circuit board or a multi-chip module containing two or more integrated circuits.

In some aspects, memory 1220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1220 may be implemented as one or more of solder down packaged integrated circuits, socketed memory modules and plug-in memory cards.

In some aspects, power management integrated circuitry 1225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1230 may provide for electrical power drawn from a network cable to provide both power supply and data connectivity to the base station radio head 1200 using a single cable.

In some aspects, network controller 1235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1245 may provide data to application processor 1205 which may include one or more of position data or time data. Application processor 1205 may use time data to synchronize operations with other radio base stations.

In some aspects, user interface 1250 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows.

An example (e.g., example 1) relates to a system for multi-band DPD for a non-linear system. The system includes a DPD circuitry configured to perform multi-band DPD on a multi-band input signal to compensate for a non-linearity of a non-linear system. The multi-band input signal includes input signals of multiple frequency bands and the DPD circuitry is configured to perform DPD on an input signal of each frequency band per frequency band. The DPD circuitry may be configured to perform the DPD using a combination of a LUT that evaluates a non-linear function and computation of terms of a non-linear polynomial of one or more variables representing the input signals of multiple frequency bands, wherein both the non-linear function and the non-linear polynomial are in a reduced dimension lower than a dimension of the multi-band input signal.

Another example (e.g., example 2) relates to a previously described example (e.g., example 1), wherein the non-linear polynomial is a linear combination of basis functions, wherein each basis function is a symmetrical multi-dimensional polynomial taking, as input variables, a magnitude or power of input signals of frequency bands other than an input signal of a frequency band on which the DPD is performed.

Another example (e.g., example 3) relates to a previously described example (e.g., example 2), wherein the symmetrical multi-dimensional polynomial is proportional to a magnitude of one of the frequency bands other than the frequency band on which DPD is performed.

Another example (e.g., example 4) relates to a previously described example (e.g., any one of examples 1-3), wherein the non-linear polynomial is in a canonical form.

Another example (e.g., example 5) relates to a previously described example (e.g., any one of examples 1-4), wherein the DPD circuitry is configured to perform interpolation or extrapolation based on the LUT.

Another example (e.g., example 6) relates to a previously described example (e.g., any one of examples 1-5), wherein the DPD circuitry is configured to perform a three-dimensional multi-band DPD using both a two-dimensional LUT and computation of one-dimensional polynomial terms.

Another example (e.g., example 7) relates to a previously described example (e.g., any one of examples 1-6), wherein the DPD circuitry is configured to perform a three-dimensional multi-band DPD using both one-dimensional LUTs and computation of two-dimensional polynomial terms.

Another example (e.g., example 8) relates to a method for multi-band DPD for a non-linear system. The method includes receiving a multi-band input signal including input signals of multiple frequency bands, and performing multi-band DPD on the multi-band input signal to compensate for a non-linearity of a non-linear system. The DPD may be performed on an input signal of each frequency band per frequency band. The DPD may be performed using a combination of a LUT that evaluates a non-linear function and computation of terms of a non-linear polynomial of one or more variables representing the input signals of multiple frequency bands, wherein both the non-linear function and the non-linear polynomial are in a reduced dimension lower than a dimension of the multi-band input signal.

Another example (e.g., example 9) relates to a previously described example (e.g., example 8), wherein the non-linear polynomial is a linear combination of basis functions, wherein each basis function is a symmetrical multi-dimensional polynomial taking, as input variables, a magnitude or power of input signals of frequency bands other than an input signal of a frequency band on which the DPD is performed.

Another example (e.g., example 10) relates to a previously described example (e.g., example 9), wherein the symmetrical multi-dimensional polynomial is proportional to a magnitude of one of the frequency bands other than the frequency band on which DPD is performed.

Another example (e.g., example 11) relates to a previously described example (e.g., any one of examples 8-10), wherein the non-linear polynomial is in a canonical form.

Another example (e.g., example 12) relates to a previously described example (e.g., any one of examples 8-11), wherein interpolation or extrapolation is performed based on the LUT.

Another example (e.g., example 13) relates to a previously described example (e.g., any one of examples 8-12), wherein a three-dimensional multi-band DPD is performed using both a two-dimensional LUT and computation of one-dimensional polynomial terms.

Another example (e.g., example 14) relates to a previously described example (e.g., any one of examples 8-13), wherein a three-dimensional multi-band DPD is performed using both one-dimensional LUTs and computation of two-dimensional polynomial terms.

Another example (e.g., example 15) relates to a non-transitory machine-readable storage medium including machine readable instructions, when executed, to implement a method as in any one of examples 8-14.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A system for multi-band digital pre-distortion (DPD) for a non-linear system, comprising:
   a DPD circuitry configured to perform multi-band DPD on a multi-band input signal to compensate for a non-linearity of a non-linear system, wherein the multi-band input signal includes input signals of multiple frequency bands and the DPD circuitry is configured to perform DPD on an input signal of each frequency band per frequency band,
   wherein the DPD circuitry is configured to perform the DPD using a combination of a look-up table (LUT) that evaluates a non-linear function and computation of terms of a non-linear polynomial of one or more variables representing the input signals of multiple frequency bands, wherein both the non-linear function and the non-linear polynomial are in a reduced dimension lower than a dimension of the multi-band input signal.

2. The system of claim 1, wherein the non-linear polynomial is a linear combination of basis functions, wherein each basis function is a symmetrical multi-dimensional polynomial taking, as input variables, a magnitude or power of input signals of frequency bands other than an input signal of a frequency band on which the DPD is performed.

3. The system of claim 2, wherein the symmetrical multi-dimensional polynomial is proportional to a magnitude of one of the frequency bands other than the frequency band on which DPD is performed.

4. The system of claim 1, wherein the non-linear polynomial is in a canonical form.

5. The system of claim 1, wherein the DPD circuitry is configured to perform interpolation or extrapolation based on the LUT.

6. The system of claim 1, wherein the DPD circuitry is configured to perform a three-dimensional multi-band DPD using both a two-dimensional LUT and computation of one-dimensional polynomial terms.

7. The system of claim 1, wherein the DPD circuitry is configured to perform a three-dimensional multi-band DPD using both one-dimensional LUTs and computation of two-dimensional polynomial terms.

8. A method for multi-band digital pre-distortion (DPD) for a non-linear system, comprising:
   receiving a multi-band input signal including input signals of multiple frequency bands; and
   performing multi-band DPD on the multi-band input signal to compensate for a non-linearity of a non-linear system,
   wherein DPD is performed on an input signal of each frequency band per frequency band,
   wherein the DPD is performed using a combination of a look-up table (LUT) that evaluates a non-linear function and computation of terms of a non-linear polynomial of one or more variables representing the input signals of multiple frequency bands, wherein both the non-linear function and the non-linear polynomial are in a reduced dimension lower than a dimension of the multi-band input signal.

9. The method of claim 8, wherein the non-linear polynomial is a linear combination of basis functions, wherein each basis function is a symmetrical multi-dimensional polynomial taking, as input variables, a magnitude or power of input signals of frequency bands other than an input signal of a frequency band on which the DPD is performed.

10. The method of claim 9, wherein the symmetrical multi-dimensional polynomial is proportional to a magnitude of one of the frequency bands other than the frequency band on which DPD is performed.

11. The method of claim 8, wherein the non-linear polynomial is in a canonical form.

12. The method of claim 8, wherein interpolation or extrapolation is performed based on the LUT.

13. The method of claim 8, wherein a three-dimensional multi-band DPD is performed using both a two-dimensional LUT and computation of one-dimensional polynomial terms.

14. The method of claim 8, wherein a three-dimensional multi-band DPD is performed using both one-dimensional LUTs and computation of two-dimensional polynomial terms.

15. A non-transitory machine-readable storage medium including machine readable instructions, when executed, to implement a method of claim 8.

* * * * *